United States Patent
Fenner et al.

(10) Patent No.: US 6,627,917 B1
(45) Date of Patent: Sep. 30, 2003

(54) METHOD AND APPARATUS FOR WAFER-LEVEL BURN-IN

(75) Inventors: Andreas A. Fenner, Chandler, AZ (US); Lary R. Larson, Gold Canyon, AZ (US); Paul F. Gerrish, Phoenix, AZ (US); Daniel E. Fulton, Tempe, AZ (US); James W. Bell, Chandler, AZ (US); James Thomas May, Tempe, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 09/557,508

(22) Filed: Apr. 25, 2000

(51) Int. Cl.[7] .................. H01L 23/58; H01L 23/544
(52) U.S. Cl. .................. 257/48; 257/620; 257/665; 257/688
(58) Field of Search .................. 257/48, 529, 665, 257/735–736, 619–620, 688; 438/17, 18, 132, 601, 68–72, 113–114, 450, 458, 461–465

(56) References Cited

U.S. PATENT DOCUMENTS

| | | | |
|---|---|---|---|
| 4,768,073 A | 8/1988 | Adams | 357/30 |
| 5,047,711 A | 9/1991 | Smith et al. | 324/158 R |
| 5,053,700 A | 10/1991 | Parrish | 324/158 |
| 5,389,556 A | 2/1995 | Rostoker et al. | 437/8 |
| 5,442,282 A | 8/1995 | Rostoker et al. | 324/158.1 |
| 5,489,538 A | 2/1996 | Rostoker et al. | 437/8 |
| 5,504,369 A | 4/1996 | Dasse et al. | 257/620 |
| 5,532,174 A | 7/1996 | Corrigan | 437/8 |
| 5,539,325 A | 7/1996 | Rostoker et al. | 324/763 |
| 5,593,903 A | 1/1997 | Beckenbaugh et al. | 437/8 |
| 5,600,257 A | 2/1997 | Leas et al. | 324/754 |
| 5,648,661 A * | 7/1997 | Rostoker et al. | |
| 5,661,042 A | 8/1997 | Fang et al. | 438/17 |
| 5,766,979 A | 6/1998 | Budnaitis | 438/15 |
| 5,895,967 A * | 4/1999 | Stearns et al. | |
| 6,118,138 A * | 9/2000 | Farnworth et al. | |
| 6,274,395 B1 * | 8/2001 | Weber | |

* cited by examiner

*Primary Examiner*—Long Pham
*Assistant Examiner*—Dilinh Nguyen
(74) *Attorney, Agent, or Firm*—Girma Wolde-Michael; Paul H. McDowall

(57) ABSTRACT

Methods and apparatus for burn-in of integrated circuit (IC) dies at the wafer level. In one embodiment, a wafer is fabricated having an array of dies formed thereon wherein the dies are separated by scribe areas. Surrounding each die is one or more ring conductors which are electrically coupled to various circuits on the die via die bond pads. The wafer further includes a series of conductive pads located in an inactive region of the wafer. Electrically connecting the conductive pads to the ring conductors is a series of redundant scribe conductors. During burn-in, a burn-in indicating apparatus located on each die monitors burn-in parameters such as elapsed burn-in time. The indicating apparatus further records the elapsed burn-in time (or other parameter). The indicating apparatus may be subsequently interrogated to verify the burn-in time.

15 Claims, 5 Drawing Sheets

METHOD AND APPARATUS FOR WAFER-LEVEL BURN-IN

TECHNICAL FIELD

The present invention relates to semiconductor fabrication. More particularly, the present invention pertains to apparatus and methods for burn-in of individual dies at the wafer level.

BACKGROUND

In conventional integrated circuit (IC) fabrication, an array of discrete ICs are formed as dies on the surface of a semiconductor wafer. Depending on the size of the die and the size of the wafer, hundreds of dies may be formed on a single wafer.

Before the dies are separated or "singulated" from the wafer, they typically undergo a testing procedure known as a wafer probe. A wafer probe tests for unwanted electrically open or shorted circuits by placing test probes across various conductive pads formed on the face of each die. Those dies that fail wafer probe are so indicated and excluded from further processing (e.g., packaging).

After such a wafer probe, the dies are singulated from the wafer, e.g., by sawing along scribe lines formed between the individual dies. The separated dies are then typically packaged to provide protection for the fragile circuits of the die as well as to provide a more convenient external lead system for electrical connection.

In its packaged form, each die undergoes more extensive functional testing to further screen out defective or substandard dies. In some instances, the die also undergoes reliability or "burn-in" testing. Static burn-in involves powering up the die for an extended period of time while dynamic burn-in additionally includes exercising some or all of the circuitry on the die. To accelerate the burn-in process, it may be conducted at elevated temperature. Burn-in is beneficial in applications where tolerance to chip failure is very low, e.g., medical devices, multi-chip modules, and the like.

While the burn-in methods described above satisfactorily produce packaged known good die, such post-singulation burn-in is inefficient for various reasons. For instance, time and expense are significant as post-singulation burn-in occurs on an individual or die-by-die basis. Further, because packaging constitutes a substantial portion of IC cost, detecting burn-in failures after packaging is not cost-effective. For these and other reasons, it is generally advantageous to burn-in dies and detect die failures prior to packaging or, where unpackaged, prior to incorporation into other modules.

One method for pre-packaged burn-in is disclosed in U.S. Pat. No. 5,489,538 to Rostoker, et al. The '538 patent describes a wafer level burn-in test where a series of dies are connected to an external current or signal source. The dies are then powered.

Another method for burning in dies at wafer level is disclosed in U.S. Pat. No. 5,600,257 to Leas et al. The '257 patent provides a test arrangement for simultaneously testing and burning-in a plurality of dies on an IC wafer.

Still other methods for powering one or more dies on a wafer prior to singulation are disclosed in U.S. Pat. No. 5,389,556 to Rostoker, et al. and U.S. Pat. No. 5,532,174 to Corrigan.

While these references describe the determination of potential die defects prior to packaging, problems remain. In particular, some of the methods provide only for serial testing of each die. This is time consuming given the number of dies on each wafer. Other methods and devices do not readily and easily identify whether a particular die was functional during the entire burn-in cycle. Thus, dies that may have had intermittent shorts or opens during burn-in may go undetected.

SUMMARY

Apparatus and methods for burn-in of dies according to the present invention avoids the above-mentioned problems. In one embodiment, a semiconductor wafer is provided. The wafer includes one or more conductive pads located in an inactive region of the wafer. The conductive pads are adapted to electrically couple to an external power supply. Also included is a plurality of dies in an active region of the wafer wherein each die includes a burn-in indicating apparatus. The burn-in indicating apparatus is adapted to indicate a burn-in parameter.

In one embodiment, the burn-in parameter is a period of time for which power is provided to the die by the external power supply. In another embodiment, the burn-in parameter is a period of time for which one or more circuits on the die is operating. The burn-in indicating apparatus, in one configuration, includes a one-bit counter adapted to switch when a pre-determined period of burn-in time has elapsed. In yet another embodiment, the burn-in indicating apparatus comprises a memory device adapted to record the burn-in parameter. The memory device may comprise one or more fuses or, in another configuration, a programmable memory device.

In yet another embodiment, a semiconductor wafer is provided which permits simultaneous burn-in of all the dies on the wafer. The wafer includes one or more conductive pads located in an inactive region of the wafer wherein the conductive pads are adapted to electrically couple to an external power supply. The wafer additionally includes a plurality of dies located in an active region of the wafer and a burn-in indicating apparatus associated with each die of the plurality of dies. The burn-in indicating apparatus is adapted to monitor one or more burn-in parameters. The wafer still further includes scribe areas separating the plurality of dies and one or more conductive rings surrounding each die, wherein the conductive rings are electrically coupled to die bond pads on each die. Scribe conductors are also included and located within the scribe areas. The scribe conductors electrically couple the one or more conductive pads to the one or more conductive rings.

In still yet another embodiment, a semiconductor wafer is provided which permits simultaneous burn-in of all the dies on the wafer. The wafer includes one or more conductive pads located on the wafer, wherein the conductive pads are adapted to couple to an external power supply. A plurality of dies is also included, wherein the plurality of dies has one or more circuits. Substantially each die of the plurality of dies also includes: a burn-in indicating apparatus adapted to monitor one or more burn-in parameters; and die bond pads on a face of the die. The die bond pads electrically couple to the one or more circuits and the burn-in indicating apparatus and further electrically coupled to the one or more conductive pads.

In still yet another embodiment, a method for simultaneous burn-in of substantially all the dies on a semiconductor wafer is provided. The method includes: fabricating a semiconductor wafer where the wafer includes a plurality of dies and one or more conductive pads electrically coupled to one or more respective die bond pads located on the plurality of dies. The method further includes connecting an external power supply to the one or more conductive pads to supply power to the plurality of dies and delivering power to the plurality of dies. The method still further includes monitoring one or more burn-in parameters with a burn-in indicating apparatus coupled to each die.

The present invention further provides an IC die, which in one embodiment, includes a burn-in indicating apparatus where the burn-in indicating apparatus is adapted to monitor one or more burn-in parameters. The IC die further includes die bond pads on a face of the die, wherein the die bond pads are electrically coupled to the burn-in indicating apparatus.

Although briefly summarized here, the invention can best be understood by reference to the drawings and the description of the embodiments which follow.

DETAILED DESCRIPTION OF EXEMPLARY EMBODIMENTS

In the following detailed description of the embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Generally, the present invention is directed to apparatus and methods for burn-in of dies while they are still part of the semiconductor wafer (i.e., burn-in at "wafer level"). Various embodiments of the invention include burn-in indicating apparatus and methods for monitoring and indicating one or more burn-in parameters, particularly the elapsed burn-in time. For example, in one configuration, a separate burn-in indicating apparatus is coupled or otherwise associated with each die on the wafer. The burn-in indicating apparatus is configured with a memory device to permanently store elapsed burn-in time for later access. While the invention certainly pertains to most any application that demands high reliability IC devices, it is perceived to be particularly advantageous for producing ICs for use with medical devices. As used herein, "medical device" includes: a pacemaker, a defibrillator, a cardioverter-defibrillator, a brain stimulator, a gastric stimulator, a drug pump, a hemodynamic monitoring device, or any other implantable device that would benefit from the techniques used and described herein. As such, a reference to any particular medical device is exemplary only and not to be construed as a limitation. With this brief summary, the present invention is now described with reference to the following description of exemplary embodiments and the accompanying figures.

Figure 1:
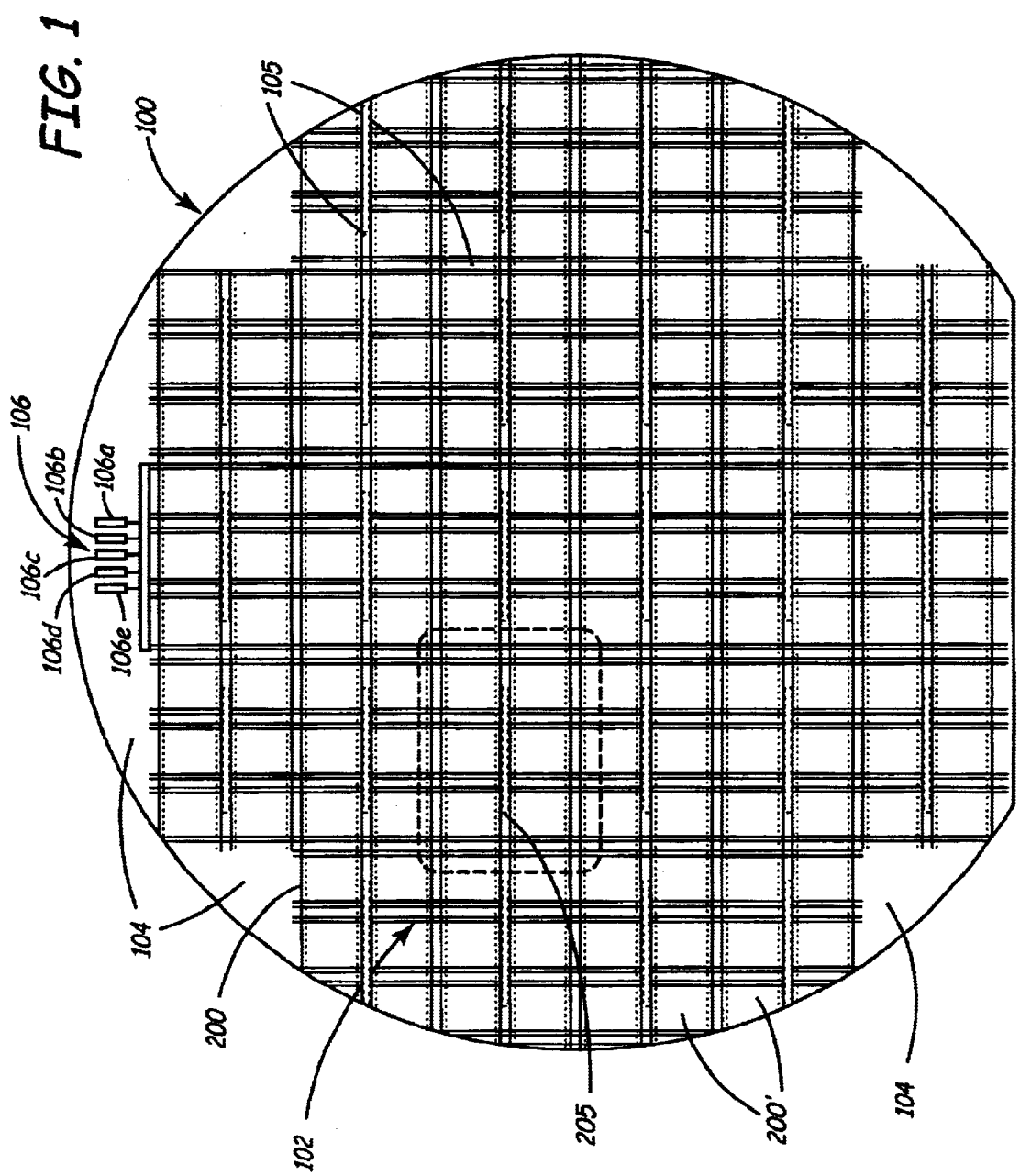
FIG. 1 is a top plan view of a wafer in accordance with one embodiment of the invention.

FIG. 1 illustrates a top plan view of an illustrative semiconductor wafer 100 that is generally at or near the end of the fabrication process. While the overall structure of the wafer and the wafer fabrication process are, for the most part, not central to the invention, some basic aspects of the wafer are briefly explained below. However, for clarity, the following description and accompanying drawings may omit wafer features/processes that are not necessary for a clear understanding of the invention.

The wafer 100, as illustrated in FIG. 1, has an active region 102 and an inactive region 104. An array of dies 200 form the active region 102 while the inactive region 104, which extends partially around the periphery of the wafer 100, does not include any whole die portions. Other portions of the wafer periphery may include partial or "mutant" dies 200'. Scribe areas 105 separate each die 200 from those dies adjacent thereto. The scribe areas or scribe lines are used as singulation lines, e.g., saw lines, to later singulate the dies 200 from the wafer 100.

A series of conductive pads 106 are formed on a portion of the inactive region 104. While shown with five pads (106a, 106b, 106c, 106d, and 106e), other embodiments having other numbers of pads are certainly possible without departing from the scope of the invention. The pads 106 are electrically coupled to one or more circuits on each die 200 as further described below.

Figure 2:
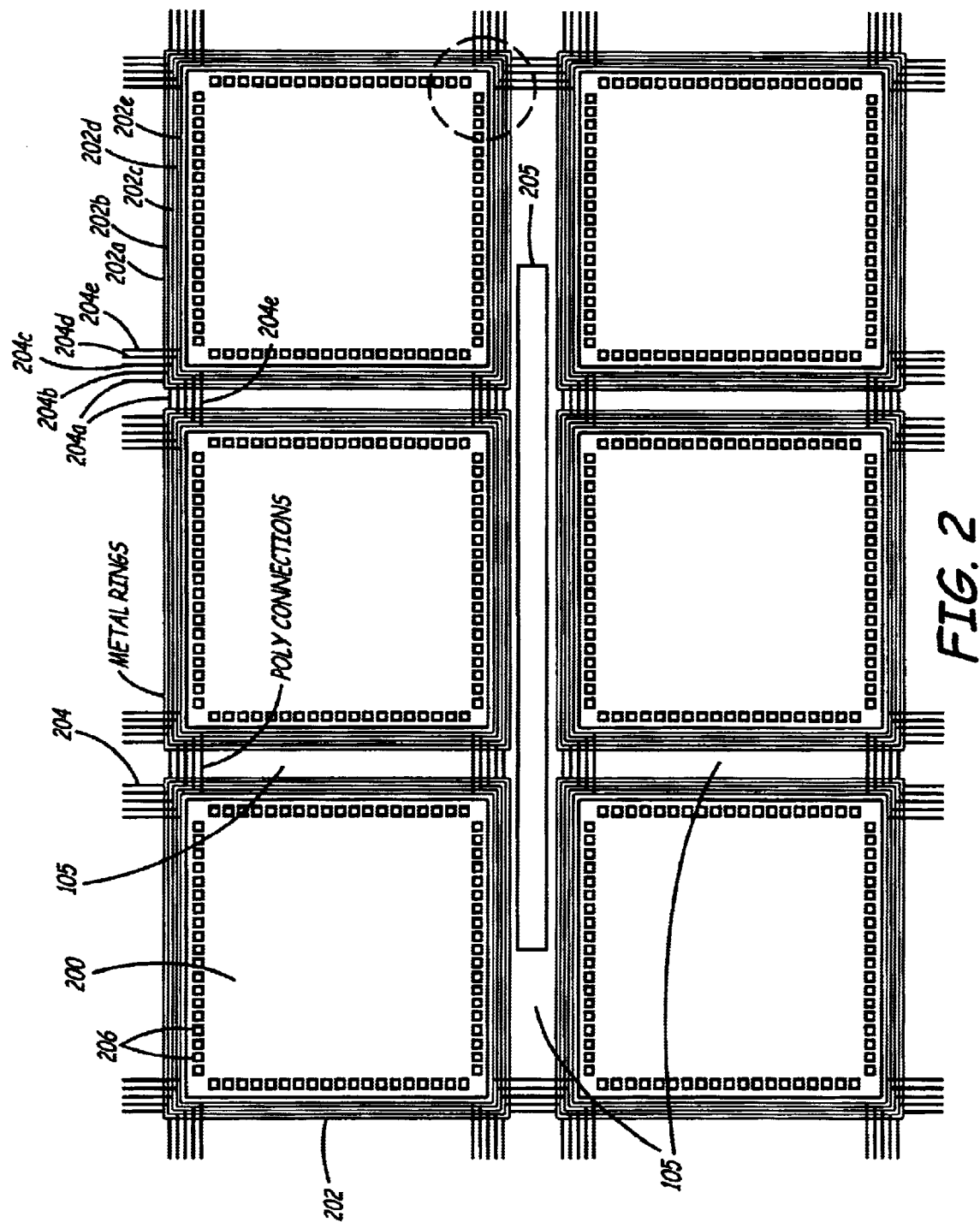
FIG. 2 is an enlarged partial view of a portion of the wafer of FIG. 1.
Figure 3:
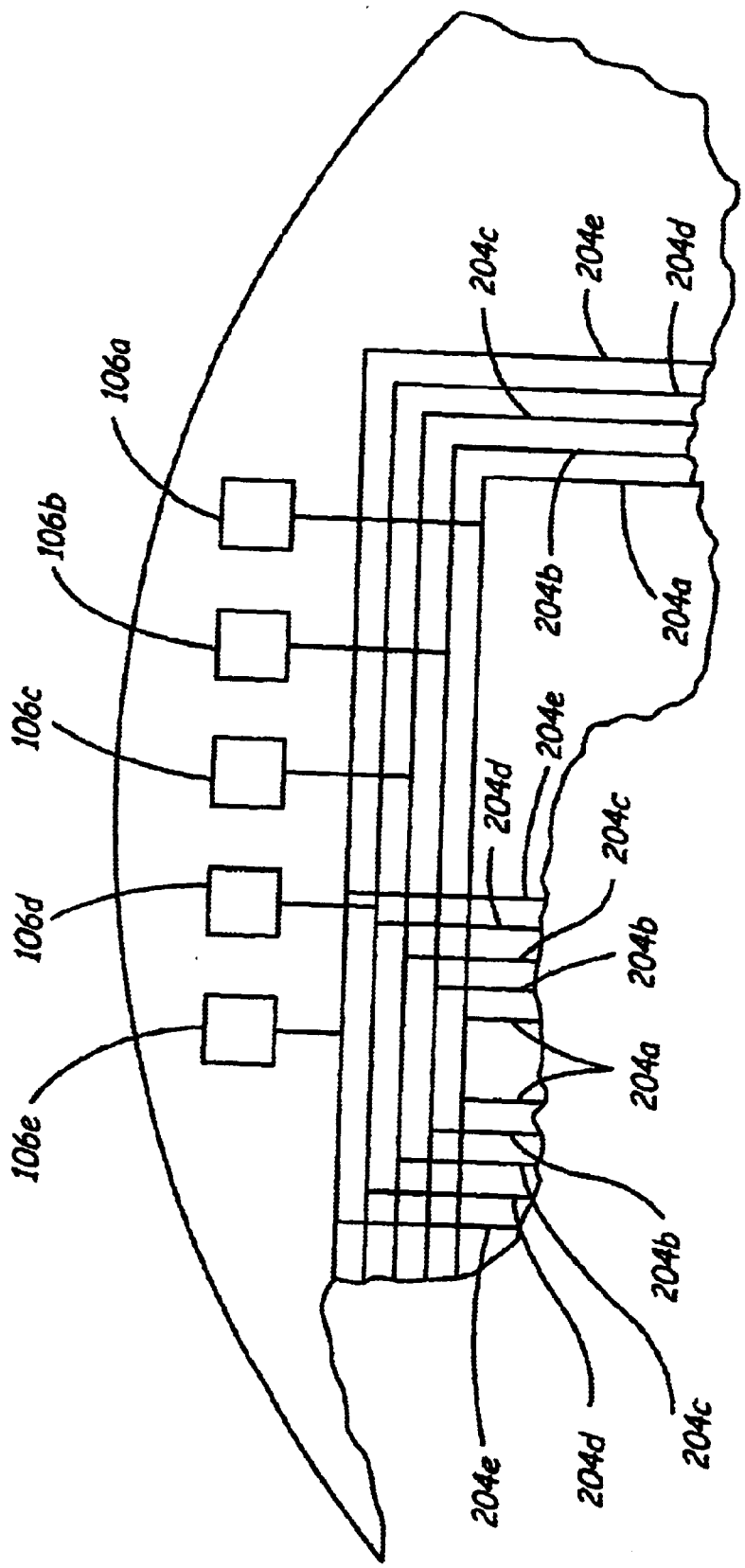
FIG. 3 is an enlarged partial view of another portion of the wafer of FIG. 1.

FIG. 2 is an enlarged partial view of a representative portion of the illustrative wafer 100 of FIG. 1. As shown, each die 200 is surrounded by a plurality of separate conductors 202 that, in one embodiment, form uninterrupted ring conductors (also referred to herein as conductive rings) around each die 200. In the embodiment illustrated in FIG. 2, each die 200 has five ring conductors (e.g., "rings" 202a, 202b, 202c, 202d, and 202e), although other numbers of rings are certainly possible as well as other ring and non-ring configurations for the conductors 202. Interconnecting the corresponding rings 202 of each die 200 is a series of individual scribe conductors 204a, 204b, 204c, 204d, and 204e (collectively referred to as scribe conductors 204) which form bridges across the scribe area 105 to connect respective rings 202 between adjacent dies 200. The scribe conductors 204 further interconnect the corresponding rings 202 to the respective pads 106 (see FIG. 1) such that electrical connection to each die 200 is obtained via the pads 106, e.g., pad 106a is coupled to conductor 204a (see FIG. 3) which is likewise coupled to ring 202a, etc. (see FIG. 2).

As illustrated in FIG. 2, the scribe conductors 204 and preferably the ring conductors 202 are formed in the scribe areas 105 during fabrication of the wafer 100. In one embodiment, the conductors 202, 204 are formed using a reticle (not shown) while in other embodiments, the conductors are formed using photomasking techniques. Regardless, the configuration of the conductors 204 preferably provides redundant interconnection between each die 200 and the pads 106. Redundancy provides not only reduced resistance between the pads 106 and each die 200 but further maintains electrical interconnection in the event a conductor 204 in one or more scribe areas 105 is damaged or is otherwise open. While shown with multiple connections, however, a scribe conductor configuration providing only a single connection to each die is also within the scope of the invention.

In the embodiment illustrated in FIGS. 1 and 2, a wafer fabrication feature 205 is shown which interferes with placement of the conductors 204 between certain dies 200. In this instance, die interconnection is maintained by the redundancy of the remaining conductors 204. However, in other embodiments that lack such a feature 205, the conductors 204 may be generally configured identically relative to each die 200.

While the conductors 202 and 204 can be made from most any conductive material, in one embodiment the conductors 202 are formed of aluminum and the conductors 204 are formed of polysilicon at or near the surface of the wafer 100. In other embodiments, the conductors 202 and 204 may both be polysilicon. By making the conductors 204 from a conductive material such as polysilicon as opposed to a metal such as aluminum, shorts caused by metal smearing during the subsequent singulation process are generally avoided.

Figure 4:
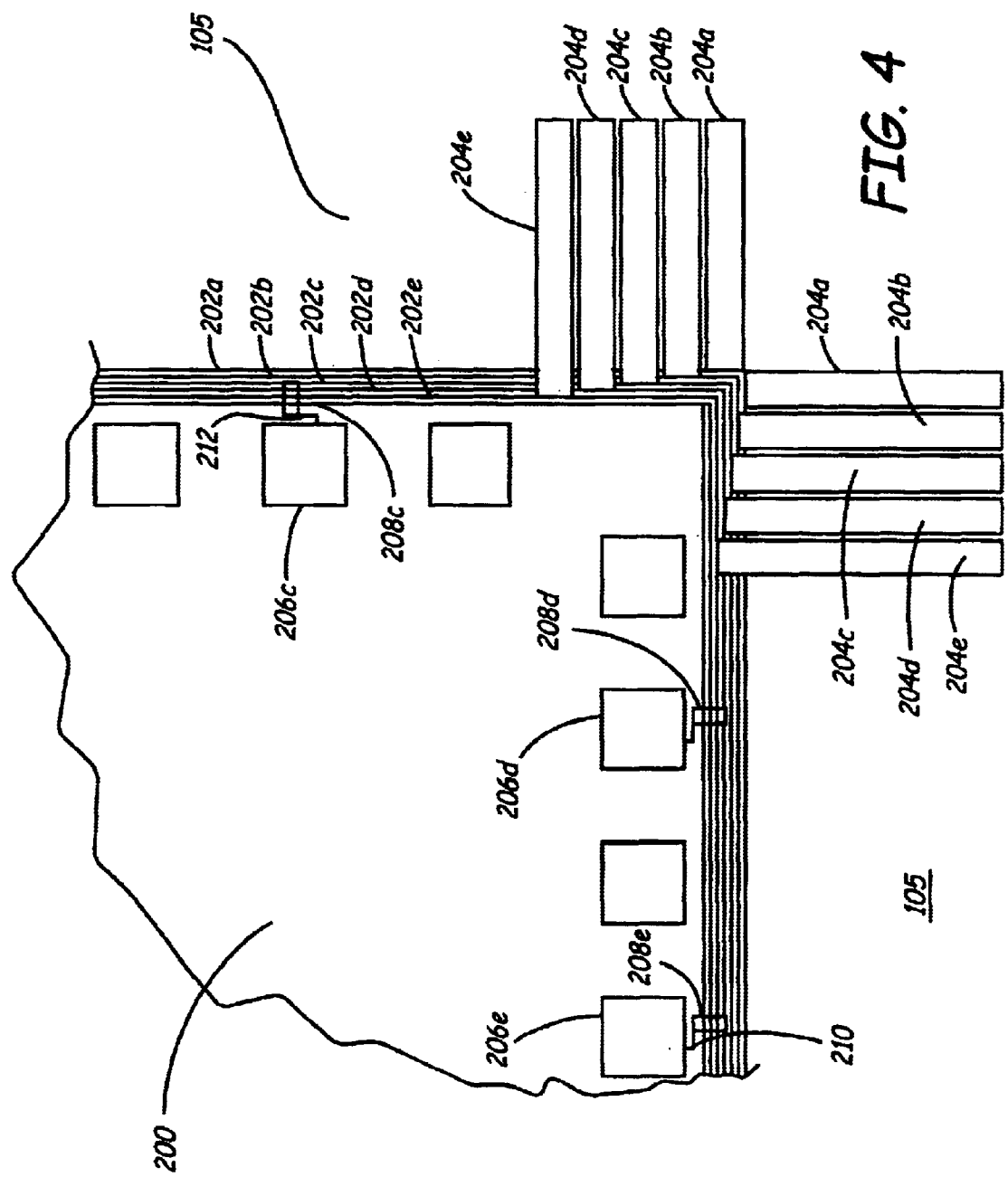
FIG. 4 is an enlarged partial view of a portion of the wafer of FIG. 2.

FIG. 4 is an enlarged partial view of a portion of the wafer 100 of FIG. 2. As evident in this view, the die 200 includes a series of conductors, which in one embodiment, are configured as die bond pads 206 on the face of the die. The die bond pads 206 permit electrical connection to the circuits of the die 200. Select die bond pads 206 are electrically coupled to one or more of the conductive rings 202 surrounding the die 200 with a die bond pad connection conductor 208. Like the scribe conductors 204 and ring conductors 202, the die bond pad connection conductors 208 may also be made of polysilicon or another non-metallic or metallic material. In the embodiment illustrated in FIG. 4, a conductor 208e is used to couple die bond pad 206e to ring conductor 202e. Similarly, die bond pad 206c is shown coupled to the ring 202c with a conductor 208c and die bond pad 206d is coupled to the ring 202d with a conductor 208d. Other die bond pads may be connected to the same or other rings 202 depending on the particular application. Because the rings 202 surround the die, interconnection to most any die bond pad 206 is unimpeded by connections made to the remaining pads 206.

Referring still to FIG. 4, the conductors 208 may be coupled or otherwise associated with electrical components such as diodes 210 and resistors 212 as needed. Diodes 210 are used to isolate various circuits on each die 200 from other circuits on the same or other dies while resistors 212 may be used to limit current such that shorts will not interfere with the operation of the other circuits on the same or other dies during burn-in.

Figure 5:
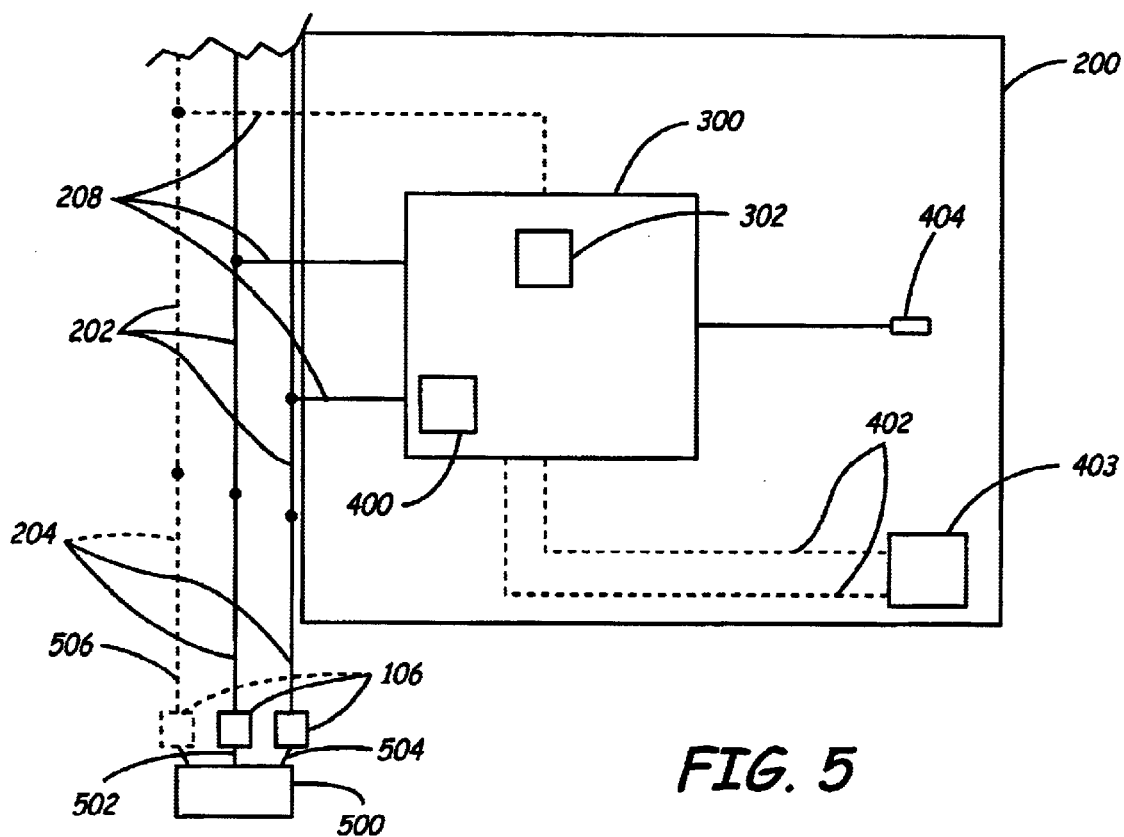
FIG. 5 is a schematic view of a wafer burn-in indicating apparatus in accordance with the invention.

As diagrammatically shown in FIG. 5, a burn-in test circuit 300 is preferably included on each die 200. The test circuit 300 is activated by an external power supply 500. For example, as shown in FIG. 5, the power supply provides a positive voltage (Vdd) 502 and a negative voltage (Vss) 504 to respective conductive pads 106 and ultimately to the necessary circuits on each die via conductors 202, 204, and 208 and one or more die bond pads 206 (not shown).

The exact configuration of the test circuit 300 is dependent on the particular functionality of the die 200. For instance, in one embodiment, the test circuit 300 may exercise only a few circuits on the die 200 while in other configurations, all of the circuits on each die are exercised. An external clocking signal 506 may be used to drive the test circuit 300 via a respective conductive pad 106. More preferably however, the die 200 uses an internal oscillator circuit 302 that exercises one or more individual circuits 403 on the die 200. While only one circuit 403 is illustrated, any number of circuits on the die may be exercised. The term "exercising" is used herein to indicate electrical cycling of the circuits in a manner that simulates actual operation. The internal oscillator 302 and the exercised circuits 403 receive power from the supply 500 via the conductive pads 106, the conductors (202, 204 and 208) and the die bond pads 206.

The die 200 further includes a burn-in indicating apparatus 400 as schematically illustrated in FIG. 5. The apparatus 400 may be a separate component of the die 200 or alternatively, may be incorporated into the test circuit 300 as schematically represented in FIG. 5. The burn-in indicating apparatus 400 monitors and records one or more burn-in parameters. For the sake of brevity, the burn-in parameter is hereinafter described as the elapsed burn-in time for the die 200. However, in other embodiments of the invention, the apparatus 400 may monitor and record different and additional burn-in parameters including, for example, output based on operation of particular circuit functions. In its simplest form, the apparatus 400 is a one bit counter and indicator which sets after the passage of a predetermined amount of time. In other embodiments, the apparatus 400 is configured as a memory device such as a register that indicates the amount of time that has passed, (e.g., minutes, hours, days, etc).

Preferably, the apparatus 400 permanently stores the burn-in information for subsequent access. For example, in one embodiment, the apparatus 400 is configured as a fuse which blows after a predetermined amount of time. Alternatively, the apparatus 400 is configured as a programmable read-only memory (PROM) device or an electrically erasable PROM (EEPROM) device which stores the elapsed burn-in time. Devices like the EEPROM are advantageous in that they permit interrogation of the apparatus 400 after an interruption to the burn-in process has occurred (e.g., power failure). By providing the elapsed burn-in time at the point of interruption, burn-in can be restarted and completed without having to repeat the entire cycle.

To ensure that the recorded time is accurate, the burn-in indicating apparatus 400 is preferably driven by on-board events. That is, rather than merely monitoring whether power is applied to the die 200, the apparatus 400 is instead triggered by signals 402 (see FIG. 5) produced by the operation of the particular circuits 403 being exercised. Accordingly, the indicating apparatus 400 may accurately identify dies 200 that had intermittent shorts or had circuits 403 that were otherwise non-functional during a portion of the burn-in cycle.

Having described wafer and die structures in accordance with various embodiments of the invention, attention is now directed to methods of burn-in in accordance with the present invention. As with the apparatus description, method steps that are not necessary for a complete understanding of the invention as well as those steps that are known to those of skill in the art are not specifically described herein.

A wafer 100 emerges from fabrication with the die bond pads 206 connected via other conductive elements (e.g., conductors 202, 204, and 208 as described above) to the respective conductive pads 106. The wafer 100 may optionally undergo a "bumping" process (providing bumps onto the die bond pads 206) to prepare the individual dies 200 for subsequent use, e.g., flip-chip bonding to printed circuit boards, in modules, etc. At this point, the wafer 100 enters burn-in testing. Depending on the particular requirements of the individual dies 200, the wafer 100 may be exposed to elevated or even cyclical temperatures during burn-in.

In preparation for burn-in of the wafer 100, the external power supply 500 (see FIG. 5) is electrically connected to the conductive pads 106. "power supply" is used herein to identify an electrical energy source that can selectively provide electricity (e.g., voltage potential, ground) and/or electrical signals to the pads 106. Depending on the burn-in sequence and the particular wafer, the power supply 500 may include any number of electrical connections. For instance, the supply 500 may include two conductive leads such as Vdd (502) and Vss (504) for supplying positive and negative voltages respectively (see FIG. 5). In addition, a ground reference (not shown) may also be provided via another pad 106. In another embodiment, a supply lead 506 for an external clocking circuit and a corresponding lead (not shown) for clocking voltage may also be provided. As is evident to those skilled in the art, the configuration of the power supply 500 can be modified to operate with most any wafer configuration without departing from the scope of the invention.

Once the supply 500 is connected to the respective conductive pads 106 and activated, current is delivered to the respective die bond pads 206 via the scribe conductors 204, ring conductors 202, and die conductors 208 as described above. The built-in test circuit 300 (see FIG. 5) then initiates a burn-in algorithm, selectively exercising the various circuits on the die in accordance with the predetermined burn-in procedure while the burn-in indicating apparatus 400 (FIG. 5) monitors the elapsed burn-in time. As previously described, the apparatus 400 can simply monitor the elapsed time for which the die 200 receives power from the supply 500. More preferably, however, it is configured to monitor on-board activity, such as signals 402 generated by the exercising of one or more circuits 403. The burn-in parameters, e.g., elapsed burn-in time, are stored by the apparatus 400 as already described herein.

When the burn-in cycle is complete, the supply 500 is disconnected and the wafer 100 is partially singulated, e.g., partially sawn, along the scribe areas 105 to sever the conductors 204. In another embodiment, diodes 210 may be used to electrically isolate the dies. Alternatively, switches (not shown) such as field effect transistor (FET) switches, could be used to electrically isolate and connect the dies. With the dies 200 electrically isolated from one another (but still attached to the wafer 100), post burn-in inspection is conducted. Preferably, the burn-in indicating apparatus 400 (see FIG. 5) of each die 200 is first interrogated by a testing device (not shown) which connects to one or more die bond pads 404 (see FIG. 5) of die bond pads 206 to determine the status of the apparatus 400. Dies 200 that failed burn-in are marked and excluded from further processing. Those that had successful burn-in then continue through additional post burn-in testing such as, for example, drain-to-drain quiescent current (IDDQ) and overvoltage testing.

At the completion of post burn-in testing, the dies 200 are singulated from the wafer 100. Those that failed burn-in or post-burn-in testing are scrapped. Those that passed are then packaged according to known packaging techniques and subsequently incorporated into the intended electronic device, e.g., medical device. Alternatively, in unpackaged applications, the die 200 is mounted, e.g., flip-chip mounted to a printed circuit board or multi-chip module. Regardless, the burn-in indicating apparatus 400 retains its stored information regarding the recorded burn in parameters, e.g., burn-in time, after packaging/mounting. In one embodiment, the die bond pads 404 may remain accessible even after packaging/mounting for subsequent interrogation.

Advantageously, the present invention permits simultaneous burn-in of IC dies at the wafer level. Thus, burn-in costs are amortized over a greater number of dies. The wafer configurations of the present invention also permit simultaneous and redundant electrical connection of an external power supply to select circuits on each die by merely connecting to a central set of conductive pads located on the wafer. Redundant connections ensures low resistance between the supply and the dies and maintains electrical connection if one connection is severed or otherwise open. Furthermore, by providing a burn-in indicating apparatus which monitors and records burn-in time, elapsed burn-in time can be independently verified prior to IC packaging/mounting or, if desired, even after.

Exemplary embodiments of the present invention are described above. Those skilled in the art will recognize that many embodiments are possible within the scope of the invention. For instance, other self test circuits and other burn-in indicating apparatus can also be used with the apparatus and methods of the present invention. Other variations, modifications, and combinations of the various parts and assemblies can certainly be made and still fall within the scope of the invention. Thus, the invention is limited only by the following claims, and equivalents thereto.

What is claimed is:

1. A semiconductor wafer comprising:
   one or more conductive pads located in an inactive region of the wafer wherein the conductive pads are adapted to electrically couple to an external power supply;
   a plurality of dies in an active region of the wafer wherein each die includes a burn-in indicating apparatus, the burn-in indicating apparatus adapted to indicate a burn-in parameter;
   an array of scribe lines separating the plurality of dies, wherein the scribe lines include one or more scribe conductors electrically coupling the one or more conductive pads to circuits of the plurality of dies;
   one or more conductive rings surrounding each die, wherein the one or more scribe conductors connects to the one or more conductive rings and the conductive rings, in turn, connect via die bond pads to the circuits of the plurality of dies.

2. A semiconductor wafer which permits simultaneous burn-in of all the dies on the wafer, the wafer comprising:
   one or more conductive pads located in an inactive region of the wafer wherein the conductive pads are adapted to electrically couple to an external power supply;
   a plurality of dies located in an active region of the wafer;
   a burn-in indicating apparatus associated with each die of the plurality of dies, the burn-in indicating apparatus adapted to monitor one or more burn-in parameters;
   scribe areas separating the plurality of dies;
   one or more conductive rings surrounding each die, wherein the conductive rings are electrically coupled to die bond pads on each die; and
   scribe conductors within the scribe areas, wherein the scribe conductors electrically couple the one or more conductive pads to the one or more conductive rings.

3. The wafer of claim 2, wherein the scribe conductors comprise bridges which extend across the scribe areas between the conductive rings of adjacent dies.

4. The wafer of claim 2, wherein the scribe conductors redundantly interconnect the conductive pads to the conductive rings.

5. The wafer of claim 2, wherein the scribe conductors comprise polysilicon.

6. The wafer of claim 2, wherein the scribe conductors are formed at or near a first surface of the wafer.

7. The wafer of claim 2, wherein the one or more burn-in parameters is a period of time for which power is provided to the die by the external power supply.

8. The wafer of claim 2, wherein the one or more burn-in parameters is a period of time for which one or more circuits on the die is operating.

9. The wafer of claim 2, wherein the burn-in indicating apparatus comprises a one-bit counter adapted to switch when a pre-determined period of burn-in time has elapsed.

10. The wafer of claim 2, wherein the burn-in indicating apparatus comprises a memory device adapted to record the one or more burn-in parameters.

11. The wafer of claim 10, wherein the memory device comprises one or more fuses.

12. The wafer of claim 10, wherein the memory device is a programmable memory device.

13. A semiconductor wafer which permits simultaneous burn-in of all the dies on the wafer, the wafer comprising:
   one or more conductive pads located on the wafer, wherein the conductive pads are adapted to couple to an external power supply; and
   a plurality of dies, wherein the plurality of dies includes one or more circuits, and wherein substantially each die of the plurality of dies comprises:
      a burn-in indicating apparatus, the burn-in indicating apparatus adapted to monitor one or more burn-in parameters; and
      die bond pads on a face of the die, the die bond pads electrically coupled to the one or more circuits and the burn-in indicating apparatus and further electrically coupled to the one or more conductive pads;
   and further comprising:
      one or more conductive rings surrounding each die, wherein the conductive rings are electrically coupled to selected die bond pads; and
      one or more scribe conductors electrically coupled to both the one or more conductive rings and the one or more conductive pads.

14. A semiconductor wafer which permits simultaneous burn-in of all the dies on the wafer, the wafer comprising:
   one or more conductive pads located on the wafer, wherein the conductive pads are adapted to couple to an external power supply; and
   a plurality of dies, wherein the plurality of dies includes one or more circuits, and wherein substantially each die of the plurality of dies comprises:
      a burn-in indicating apparatus, the burn-in indicating apparatus adapted to monitor one or more burn-in parameters; and
   further comprising die bond pads on a face of the die, the die bond pads electrically coupled to the one or more circuits and the burn-in indicating apparatus and further electrically coupled to the one or more conductive pads; and further comprising:
      one or more conductive rings surrounding each die, wherein the conductive rings are electrically coupled to selected die bond pads; and
      one or more scribe conductors electrically coupled to both the one or more conductive rings and the one or more conductive pads; and
      wherein the conductive rings are electrically coupled to the die bond pads with a resistor.

15. A semiconductor wafer which permits simultaneous burn-in of all the dies on the wafer, the wafer comprising:
   one or more conductive pads located on the wafer, wherein the conductive pads are adapted to couple to an external power supply; and
   a plurality of dies, wherein the plurality of dies includes one or more circuits, and wherein substantially each die of the plurality of dies comprises:
      a burn-in indicating apparatus, the burn-in indicating apparatus adapted to monitor one or more burn-in parameters; and
   further comprising die bond pads on a face of the die, the die bond pads electrically coupled to the one or more circuits and the burn-in indicating apparatus and further electrically coupled to the one or more conductive pads; and further comprising:
      one or more conductive rings surrounding each die, wherein the conductive rings are electrically coupled to selected die bond pads; and
      one or more scribe conductors electrically coupled to both the one or more conductive rings and the one or more conductive pads and;
      wherein the conductive rings are electrically coupled to the die bond pads with a diode.

* * * * *